(12) United States Patent
Oh

(10) Patent No.: US 8,257,129 B2
(45) Date of Patent: Sep. 4, 2012

(54) METHOD FOR MANUFACTURING FLEXIBLE DISPLAY DEVICE HAVING AN INSULATIVE OVERCOAT AND FLEXIBLE DISPLAY DEVICE HAVING THE SAME

(75) Inventor: Eui Yeol Oh, Yongin-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/046,435

(22) Filed: Mar. 11, 2011

(65) Prior Publication Data

US 2011/0163067 A1     Jul. 7, 2011

Related U.S. Application Data

(62) Division of application No. 11/808,717, filed on Jun. 12, 2007.

(30) Foreign Application Priority Data

Nov. 27, 2006   (KR) .......................... 10-2006-117867

(51) Int. Cl.
*B32B 37/12* (2006.01)
*B32B 37/02* (2006.01)
*B32B 37/14* (2006.01)
*B32B 37/10* (2006.01)

(52) U.S. Cl. ............ 445/24; 313/506; 313/511; 257/40; 257/296

(58) Field of Classification Search .......... 313/498–512; 445/24–25; 257/40, 269
See application file for complete search history.

(56) References Cited

U.S. PATENT DOCUMENTS

| | | |
|---|---|---|
| 5,162,933 A | 11/1992 | Kakuda et al. |
| 5,317,433 A | 5/1994 | Miyawaki et al. |
| 5,339,181 A | 8/1994 | Kim et al. |
| 5,462,887 A | 10/1995 | Gluck |
| 5,668,379 A | 9/1997 | Ono et al. |
| 5,731,856 A | 3/1998 | Kim et al. |
| 5,771,083 A | 6/1998 | Fujihara et al. |
| 5,793,460 A | 8/1998 | Yang |
| 5,847,781 A | 12/1998 | Ono et al. |
| 6,008,588 A * | 12/1999 | Fujii .......................... 315/169.3 |
| 6,268,279 B1 | 7/2001 | Okada |
| 6,866,555 B2 * | 3/2005 | Tsutsui et al. ................. 445/24 |
| 7,182,664 B2 | 2/2007 | Yanagawa |

(Continued)

FOREIGN PATENT DOCUMENTS

CN    1517749 A    8/2004

(Continued)

OTHER PUBLICATIONS

Japanese Office Action dated Aug. 1, 2011 for JP Patent Application 2010-241919.

(Continued)

*Primary Examiner* — Tracie Y Green
(74) *Attorney, Agent, or Firm* — Morgan, Lewis & Bockius LLP

(57) ABSTRACT

A flexible display device and a method for manufacturing a flexible display are provided. The flexible display device includes a flexible substrate, a display element layer formed on the flexible substrate; an insulating protective layer covering the display element layer; and a rigid substrate. The rigid substrate has an etching selectivity at least 20 times greater than that of the insulating protective layer.

12 Claims, 20 Drawing Sheets

U.S. PATENT DOCUMENTS

| | | | |
|---|---|---|---|
| 2002/0149320 A1 | 10/2002 | Maruyama et al. | |
| 2003/0010970 A1 | 1/2003 | Hara et al. | |
| 2003/0174275 A1 | 9/2003 | Asano et al. | |
| 2003/0199127 A1 | 10/2003 | Liao et al. | |
| 2004/0115852 A1 | 6/2004 | Park et al. | 438/30 |
| 2004/0142118 A1 | 7/2004 | Takechi | |
| 2004/0149987 A1 | 8/2004 | Kim et al. | |
| 2004/0209405 A1* | 10/2004 | Kwak et al. | 438/143 |
| 2004/0214449 A1* | 10/2004 | Yotsuya et al. | 438/742 |
| 2004/0232104 A1 | 11/2004 | Kinoshita et al. | |
| 2004/0232459 A1 | 11/2004 | Takayama et al. | |
| 2004/0247949 A1 | 12/2004 | Akedo et al. | |
| 2005/0242352 A1 | 11/2005 | Jeoung et al. | |
| 2006/0108653 A1 | 5/2006 | Koo et al. | |
| 2006/0192487 A1 | 8/2006 | Choi et al. | |
| 2007/0102703 A1* | 5/2007 | Yamazaki et al. | 257/59 |

FOREIGN PATENT DOCUMENTS

| | | |
|---|---|---|
| CN | 1527115 A | 9/2004 |
| JP | 11-345875 | 12/1992 |
| JP | 2000-112399 | 4/2000 |
| JP | 2002-072905 | 3/2002 |
| JP | 2002-164354 | 6/2002 |
| JP | 2003-022034 | 1/2003 |
| JP | 2003-133411 | 5/2003 |
| JP | 2003-303880 | 10/2003 |
| JP | 2004-228551 | 8/2004 |
| JP | 2004-259796 | 9/2004 |
| JP | 2006-236626 | 9/2006 |
| JP | 2006-245067 | 9/2006 |
| KR | 10-2005-0122541 | 12/2005 |
| WO | 2004-040649 | 5/2004 |
| WO | 2004/040649 | 5/2004 |

OTHER PUBLICATIONS

U.S. Office Action dated Sep. 9, 2011 for U.S. Appl. No. 11/808,717 (parent application).

Juncheng Zheng, et al., *Current Situation of Flexible Display*, Automatication, No. 12, 2005, pp. 10-12.

U.S. Office Action dated Feb. 2, 2012 (U.S. Appl. No. 11/808,717).

* cited by examiner

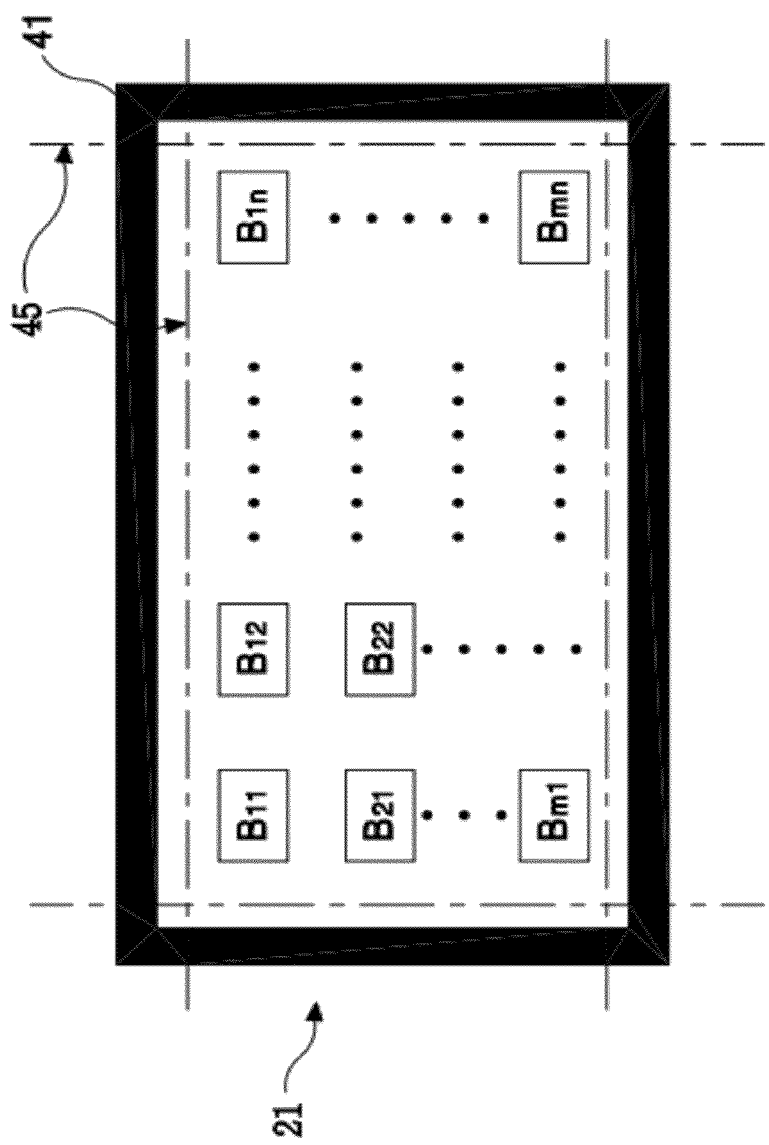

сcess. The insulating protection layer 3 is made of a silicon oxide (SiOx) or a silicon nitride (SiNx).

METHOD FOR MANUFACTURING FLEXIBLE DISPLAY DEVICE HAVING AN INSULATIVE OVERCOAT AND FLEXIBLE DISPLAY DEVICE HAVING THE SAME

This application is a divisional of U.S. application Ser. No. 11/808,717, filed Jun. 12, 2007, and also claims the benefit of Korean Patent Application No. 10-2006-117867 filed in Korea on Nov. 27, 2006, both of which are hereby incorporated by reference.

BACKGROUND OF THE INVENTION

1. Field of the Invention

The present invention relates to a method for manufacturing a flexible display device and a flexible display device thereby, and more particularly, to a method for manufacturing a flexible display device in which the stability of the process is enhanced and the production yield is increased.

2. Description of the Related Art

In the display device market, the flat panel display (hereinafter "FPD") has been remarkably rapidly replacing the CRT (cathode ray tube) monitor. There are many kinds of FDP devices, for example, the liquid crystal display (LCD), the plasma display panel (PDP) and the organic electro-luminescence display (OELD). An FPD has lighter weight and thinner thickness as compared with a CRT. Therefore, an FPD is particularly suitable for a large size display system or a portable display system. Because the main elements of the FPD are formed by high temperature processes, most FPD uses glass substrates to endure against the high temperature required in the manufacturing processes. However, because the glass substrate is rigid at room temperature, the glass substrate cannot be freely applied to a flexible display device. Recently, flexible materials have been used for the FPD to develop flexible display devices such that the displays can be rolled or folded to be freely handled in any conditions. That is, using a flexible material such as plastic film or metal foil, a flexible display will have the same display performance even when it is rolled or bent and, therefore, are of great interest in the display industries.

The currently used flexible substrate materials such as plastic substrates or metal foils have the heat resistances inferior to those of glass substrates. Therefore, these flexible substrates can be easily deformed by the high temperatures applied during the processing steps for manufacturing the display elements. The deformed substrate cannot guarantee the quality of the display elements formed thereon. That is, it is impossible to form the display elements on the flexible substrate directly.

Recently, to overcome the above problem, the substrate transcription method has been suggested. After forming the display elements on a rigid substrate, such as a glass substrate, a flexible substrate is attached to the display elements, and then, the glass (rigid) substrate is removed.

The FIGS. 1A to 1D illustrate a method for manufacturing the flexible display device according to the substrate transcription method according to the related art. The substrate transcription method includes forming an insulating protection layer 3 on a glass substrate 1, forming a display element layer 5, attaching a flexible substrate 7, and removing the glass substrate 1 and the insulating protection layer 3.

In the step of forming the insulating protection layer 3, as shown in FIG. 1A, the insulating protection layer 3 is deposited on a glass substrate 1 with a thickness to have enough thermal resistance against the heat of the manufacturing pro- In the step for forming the display element layer 5, as shown in FIG. 1B, various elements (lines, electrodes, thin film transistors, etc) configuring the display elements are formed on the insulating protection layer 3. The step for forming the display element layer 5 includes many photolithography processes and etching processes.

In the step for attaching the flexible substrate 7, as shown in FIG. 1C, the flexible substrate 7, such as a thin plastic substrate or a metal foil, is attached on the display element layer 5 by an adhesive. The flexible substrate 7 will be the actual substrate of the display device to support the display element layer 5 while permitting flexibility of the display device.

Finally in the step of removing the glass substrate 1 and the insulating protection layer 3, as shown in FIG. 1D, the glass substrate 1 and the insulating protection layer 3 are removed using an etchant, such as hydrogen fluoride (HF). Further, a polishing method using a grinder, such as alumina, is used after etching the glass substrate 1 for enhancing the etched surface. The polishing method for removing the glass substrate 1 cannot be applied when the size (diagonal length) of the glass substrate 1 is larger than 1 m. When removing the glass substrate 1 having a diagonal length over 1 m, the etching process is only used. Because only the flexible substrate 7 remains on the display element layer 5, the display device is flexible.

As mentioned above, when the etching process is applied to the substrate transcription method, the etchant may intrude into and attack the display element layer 5 while the insulating protection layer 3 is removed. As a result, the stability of the production process and the production yield of the flexible display device are degraded.

SUMMARY OF THE INVENTION

Accordingly, the present invention is directed to a method for manufacturing the flexible display device and a flexible display device that substantially obviates one or more of the problems due to limitations and disadvantages of the related art.

An object of the present invention is to provide a method for manufacturing a flexible display device where production stability is ensured.

Another objection of the present invention is to provide a method for manufacturing a flexible display device manufacturing method with enhanced production yield.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a flexible display device comprises a flexible substrate; a display element layer formed on the flexible substrate; an insulating protective layer covering the display element layer; and a rigid substrate having an etching selectivity at least 20 times greater than that of the insulating protective layer.

In another aspect, a manufacturing method for flexible display device comprises the steps of forming an insulating protection layer on a first substrate; forming a display element layer on the insulating protection layer; attaching a flexible substrate on the display element layer; and etching the first substrate to remove the first substrate using an etchant having a selective etching ratio of the insulating protection layer to the first substrate of less than 1/20.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 5A and 5B illustrate methods for forming and removing a resin barrier shown in the FIGS. 4A and 4B according to exemplary embodiment of the present invention;

DETAILED DESCRIPTION OF THE PREFERRED EMBODIMENTS

Reference will now be made in detail to the preferred embodiments of the present invention, examples of which are illustrated in the accompanying drawings. The present invention will now be described with reference to FIG. 2 through FIG. 8.

In the method for manufacturing a flexible display device and the structure of a flexible display device according to the present invention, the insulating protection layer exists at the final structure of the flexible display device. To protect the display devices from the etchant in the process for etching the rigid substrate, thereby removing it from the final flexible display device, the insulating protection layer is not removed during the manufacturing process. Thus, the insulating protection layer remains in the final product.

Figure 1A:
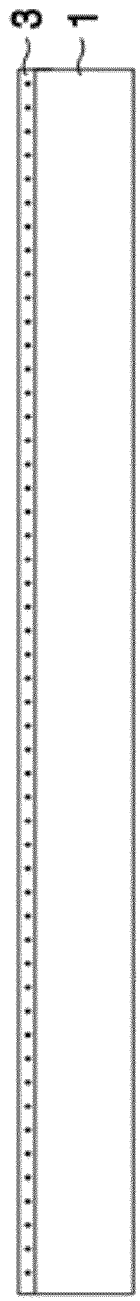
FIGS. 1A to 1D illustrate a method for manufacturing a flexible display device step-by-step using the substrate transcription method according to the related art.
Figure 1B:
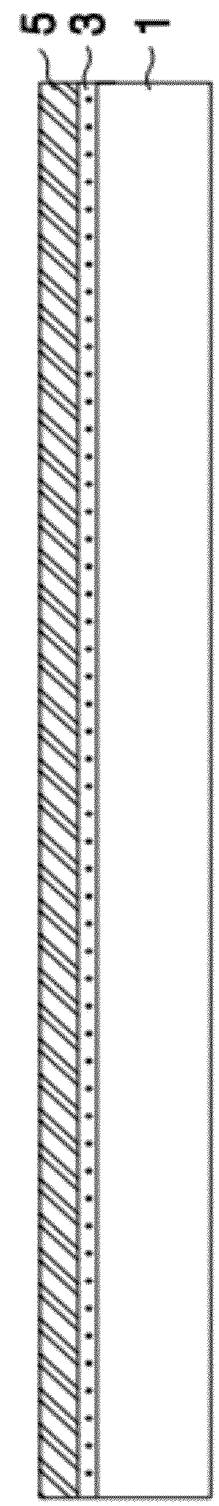
Figure 1C:
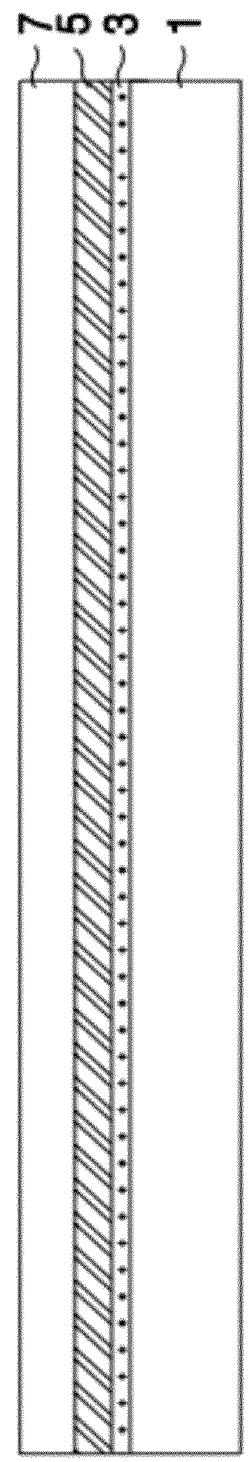
Figure 1D:
Figure 2:
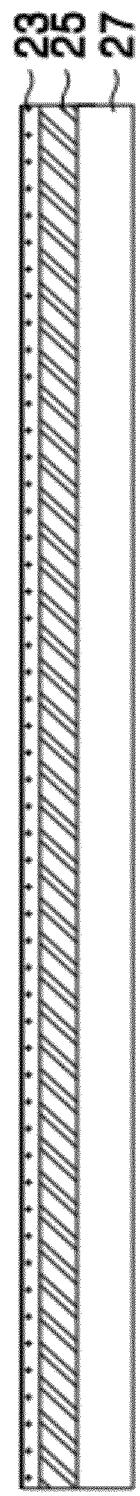
FIG. 2 illustrates a structure of a flexible display device according to a first exemplary embodiment of the present invention.

The flexible display device according to the first exemplary embodiment of the present invention, as shown in FIG. 2, includes a flexible substrate 27, a display element layer 25 on the flexible substrate 27 and an insulating protection layer 23 formed on the display element layer 25. Further, the insulating protection layer 23 may comprise a multiple layer structure.

Figure 3A:
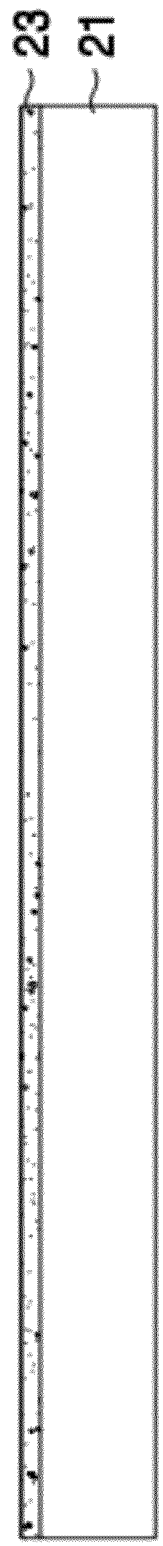
FIGS. 3A to 3D illustrate a method for manufacturing a flexible display device step-by-step according to the first exemplary embodiment of the present invention.

As shown in FIGS. 3A to 3D, the method for manufacturing the flexible display device according to the first exemplary embodiment of the present invention includes steps of forming an insulating protection layer 23 on a glass substrate 21, forming a display element layer 25, attaching a flexible substrate 27 and removing the glass substrate 21. As shown in FIG. 3A, in the first step of the method for manufacturing a flexible display device according to the first exemplary embodiment, an insulating protection layer 23 is deposited on one side of a glass substrate 21, a rigid substrate. The insulating protection layer 23 includes a silicon layer or a metal oxide layer, such as chrome oxide ($Cr_xO_y$), tantalum oxide ($Ta_xO_y$) or aluminum oxide ($Al_xO_y$). When the silicon layer is used for the insulating protection layer 23, it is deposited on the glass substrate 27 using a PECVD method. When the metal oxide layer is used for the insulating protection layer 23, a metal layer is deposited by the sputtering method, and then, the metal layer is oxidized using an $O_2$ plasma or the anodizing method.

Figure 3B:
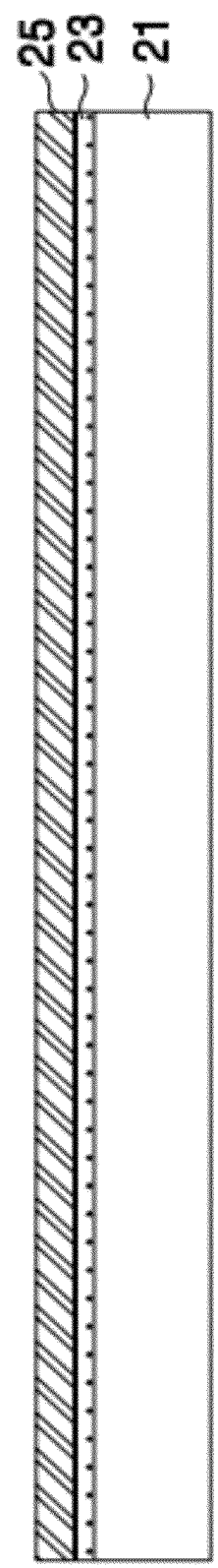

As shown in FIG. 3B, in the second step of the method according to the first exemplary embodiment, a display element layer 25 is formed on the insulating protection layer 25. The display element layer 25 includes various elements for operating the display device. For example, if the flexible display device is for a TFT LCD device, the display element layer 25 can include a TFT array, gate lines and data lines. If the flexible display device is for an OELD device, the display element layer 25 can include an organic diode array.

Figure 3C:
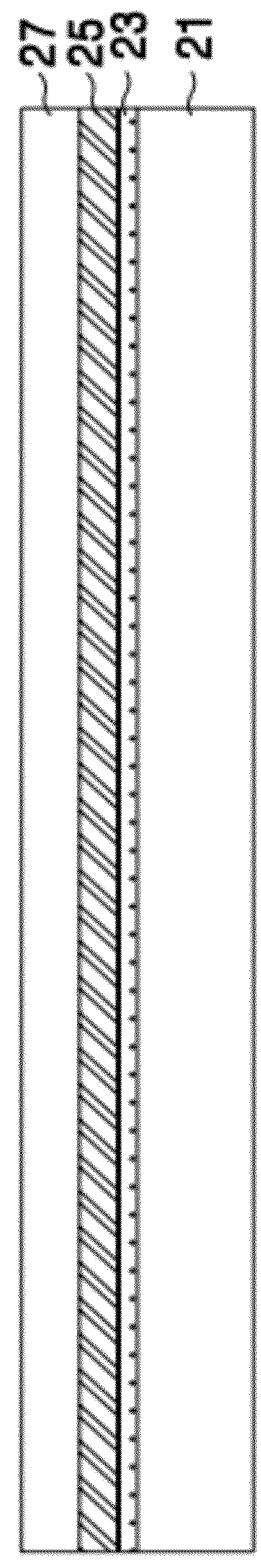

As shown in FIG. 3C, in the third step of the method according to the first exemplary embodiment, a flexible substrate 27 is attached on the display element layer 25 with an acrylic adhesive including chloroform. The flexible substrate 27 will be the actual substrate of the display device to support the display element layer 25 while permitting flexibility of the display device.

Figure 3D:
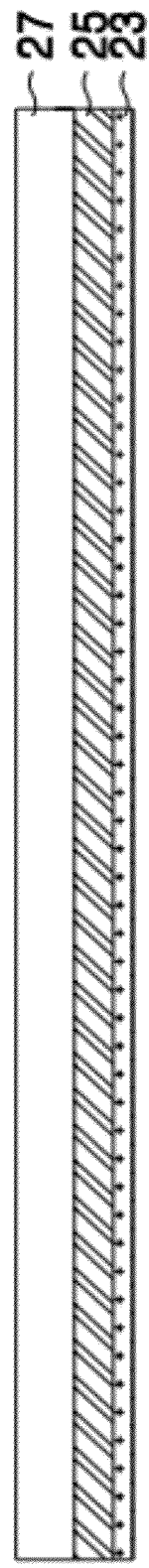

As shown in FIG. 3D, in the fourth step of the method according to the first exemplary embodiment, the glass substrate 21 is removed by an etching process, such as wet etching or dry etching. For wet etching, the etchant includes buffered hydrogen fluoride ($HF+NH_4F$:BHF). For dry etching, the etchant includes $CF_4+O_2$ or $SF_6+O_2$.

In the process for etching the glass substrate 21, the processing time includes the etch time, the theoretical time required to completely remove the glass substrate 21, and the over etch time in addition to the etch time. The over etch time is determined in consideration that unetched parts remain after the etch time, thereby ensuring the uniformity of the etched surface. The insulating protection layer 23 protects the display element layer 25 during the etching process. That is, the insulating protection layer 23, in an exemplary situation, should not be etched in the step for removing the glass substrate 21. As a result, in this exemplary method for manufacturing the flexible display device according to the present invention, the etching ratio of the glass substrate 21 to the insulating protection layer 23 is 20:1 or higher (for example 30:1 or 40:1). Thus, the insulating protection layer 23 is etched with unit amount of 1 while the glass substrate is etched with amount of 20 units at the same time. This is, for the insulating protection layer 23 is not etched when the glass substrate 21 is etched out in the over etch time. The etch ratio can be varied according to the thickness of the glass substrate 21. The ratio of 20:1 is determined by considering that the thickness of currently used glass substrate 21 is in range of 200 μm-700 μm. In the first exemplary embodiment, the etching selectivity of the silicon layer to the glass is 1/20 or less. That is, the etching ratio of the glass to the silicon layer is 20:1 or higher. Therefore, the silicon layer is not etched during the over etch time of the etching process.

When the insulating protection layer 23 is deposited thicker, it would not be removed during the over etch time. However, it may be restricted to be under certain thickness.

The reason for restricting the thickness of the insulating protection layer 23 is that the glass substrate 21 has a stress from the deposited insulating protection layer 23. Specifically, the glass substrate 21 is hardly deformed by the heat because it has a high thermal expansion coefficient. However, the insulating protection layer 23 having a low thermal expansion coefficient is easily shrunken after being deposited on the glass substrate 21. Therefore, when the insulating protection layer 23 is deposited in thick on the glass substrate, the glass substrate 21 is affected by the stress from the shrinkage of the insulating protection layer 23. This stress from the insulating protection layer 23 is proportional to its thickness. So that, the glass substrate 21 may be cracked or broken. As a result, the display element layer 25 on the glass substrate 21 may be damaged. Therefore, it is preferable to set the thickness of the insulating protection layer 23 to be less than 1 μm.

After removing the glass substrate 21, turning over the final product, then the flexible display device as shown in FIG. 2 can be completed.

Figure 4A:
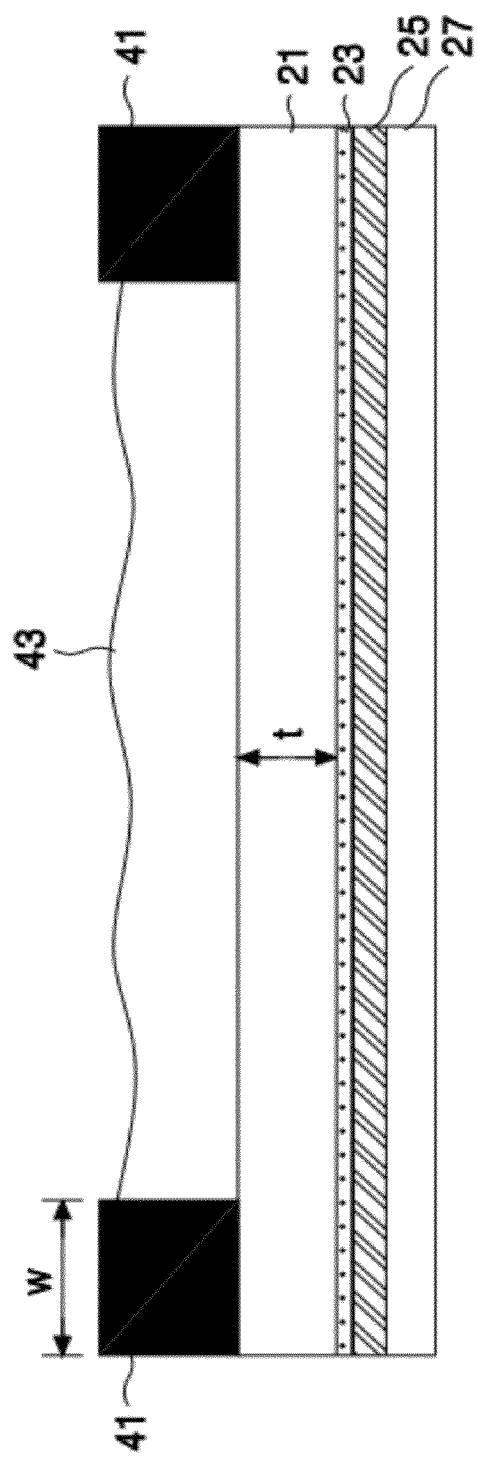
FIGS. 4A and 4B illustrate a method for etching the glass substrate according to an exemplary embodiment of the present invention.
Figure 4B:
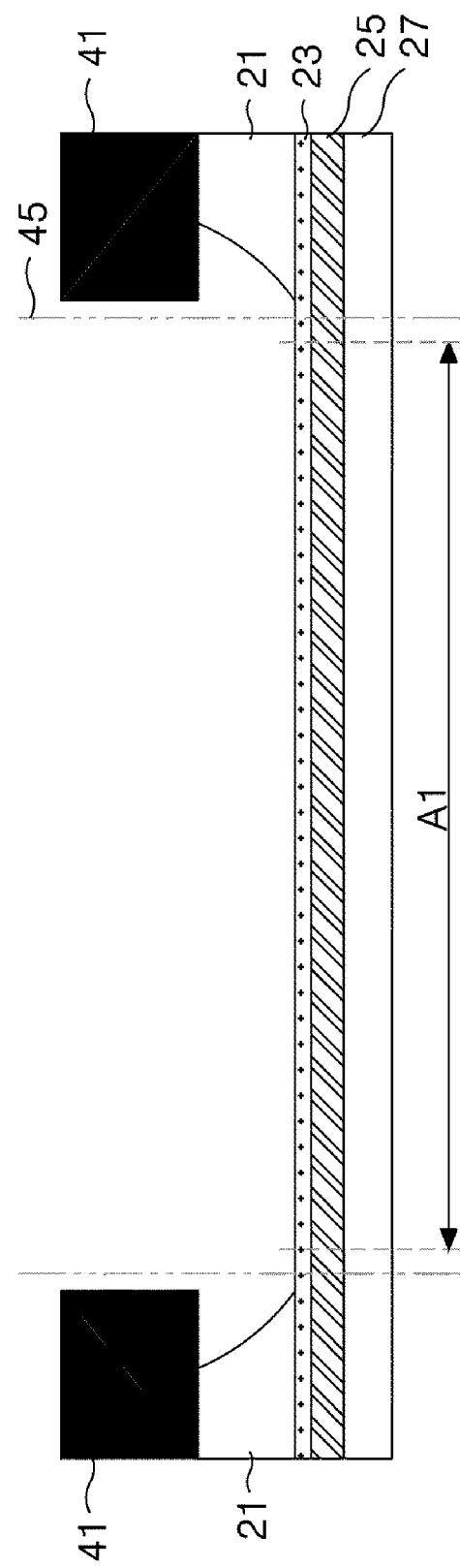

FIGS. 4A and 4B explain the method for etching the glass substrate. After attaching the flexible substrate 27 on the display element layer 25, the display structure may be soaked into a bath filled with an etchant. By dipping the whole display device into an etchant, the display element layer 25 may be damaged by the etchant through the lateral side. To overcome this problem, in an exemplary technique of the present invention, turning over the display device after attaching the flexible substrate 27 as shown in FIG. 4A, a resin barrier 41 is formed on the edge of the other side of the glass substrate 21. Within the resin barrier 41, an etchant 43 is filled by the VALC method after calculating a required etchant amount for removing the glass substrate 21. After removing the glass substrate 21 using the etchant, the resin barrier is removed by cutting the display device along the cutting line 45. The cutting line 45 is disposed between the resin barrier 41 and the effective region (A1) of the display device. The effective region (A1) is the area in which the elements of the display device are formed.

In the step of etching the glass substrate 21, the etchant may attack the glass substrate 21 under the resin barrier 41 so that the under-cut may be formed as shown in FIG. 4B. When the width (w) of the resin barrier 41 is equal to or less than the thickness (t) of the glass substrate 21, the resin barrier 41 may be cut out by this under cut phenomena. In that case, the etchant may attack the display element layer 25 at this portion. Therefore, to stably complete the etching process, the width of the resin barrier 41 should be thicker than the thickness of the glass substrate 21.

Figure 5B:
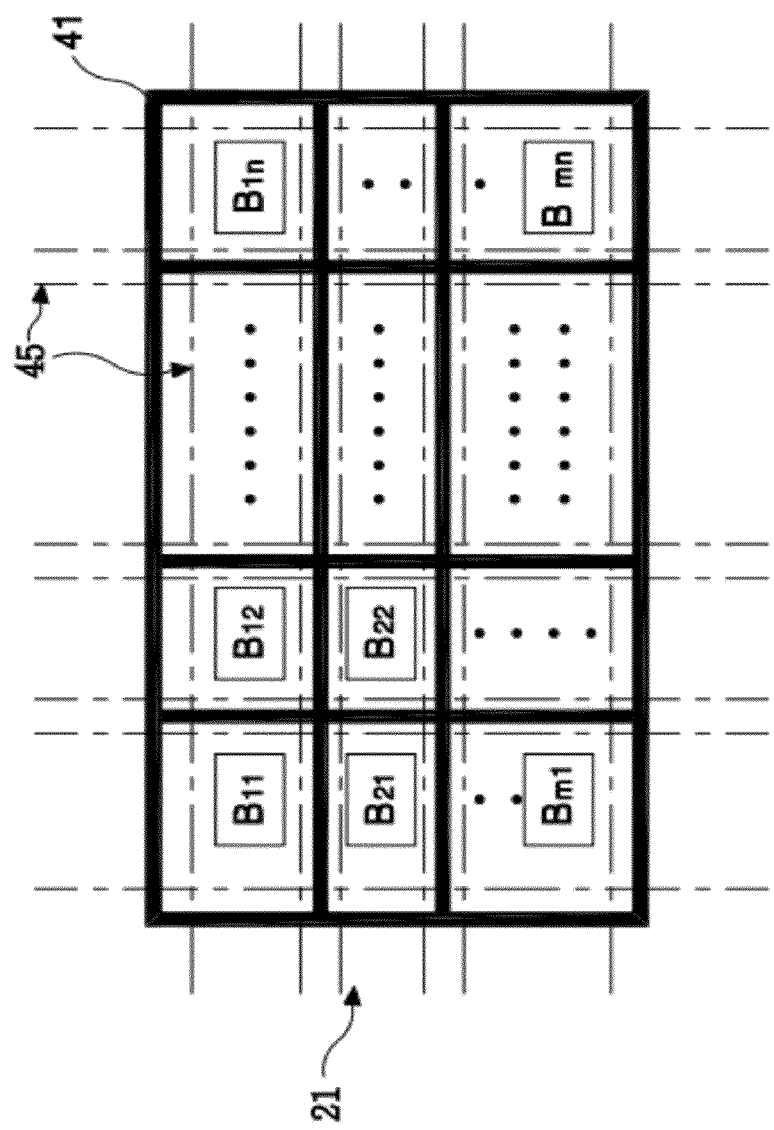

FIGS. 5A and 5B explain the pattern of the resin barrier 41 of FIGS. 4A and 4B and the method for removing the resin barrier 41. In the effective region (A1) of the display device, many units of display panel (Bmn: m and n are positive integer numbers) are disposed in a matrix array. The unit display panels (Bmn) are separated with a certain distance between them.

For one example for pattern of resin barrier 41, the resin barrier 41 is formed at the four edge side edges of the glass substrate 21 to surround all unit display panels (Bmn) as shown in FIG. 5A. In that case, the cutting line 45 for removing the resin barrier 41 is disposed between the resin barrier 41 and the set of all units (Bmn). For the final product, each unit display panel should be separated independently. Therefore, after cutting out the resin barrier 41, each unit display panel should be separated by cutting the flexible display device in a unit panel (Bmn).

For another example for pattern of resin barrier 41, as shown in FIG. 5B, the resin barrier 41 is formed with a matrix shape to surround each unit display panel (Bmn). In that case, the cutting line 45 is disposed between each unit display panel (Bmn) and the resin barrier 41. By cutting the flexible display panel along the cutting line 45, the resin barrier 41 is removed and the respective unit display panels are separated.

Figure 6:
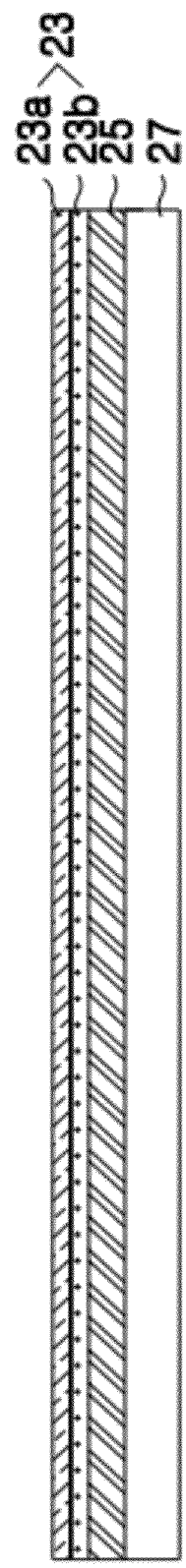
FIG. 6 illustrates a flexible display device according to a second exemplary embodiment of the present invention.

As shown in FIG. 6 illustrating a second exemplary embodiment of the present invention, the flexible display panel includes a flexible substrate 27, a display element layer 25 formed on the flexible substrate 27 and an insulating protection layer 23 including a first protection layer 23a and a second protection layer 23b. The first protection layer 23a includes the silicon layer or the metal oxide layer. The second protection layer 23b includes silicon nitride (SiNx) or silicon oxide (SiOx) having a better insulating property than the first protection layer 23a. In the second exemplary embodiment of the present invention, except that the insulating protection layer 23 includes the two layers, others are the same as in the first embodiment.

The method for manufacturing the flexible display device according to the second exemplary embodiment of the present invention is different from the first exemplary embodiment in the step of forming the insulating protection layer 23. Except for forming the insulating protection layer 23 including the first protection layer 23a and the second protection layer 23b, the other steps are the same as in the first exemplary embodiment of the present invention. Therefore, the same explanation is not duplicated here. A silicon nitride (SiNx) or a silicon oxide (SiOx) is deposited on the glass substrate 21 by PECVD method to form the first protection layer 23a. Then, in the same PECVD method, a silicon material is deposited on the first protection layer 23a continuously to form the second protection layer 23b. Alternatively, a metal material may be deposited on the first protection layer 23a and the metal material may be oxidized by an $O_2$ plasma or an anodizing method to form the second protection layer 23b. After that, by the same method explained in the first exemplary embodiment, the display element 25 is formed, the flexible substrate is attached, and the glass (rigid) substrate is removed to complete the flexible display device as shown in FIG. 6.

Figure 7:
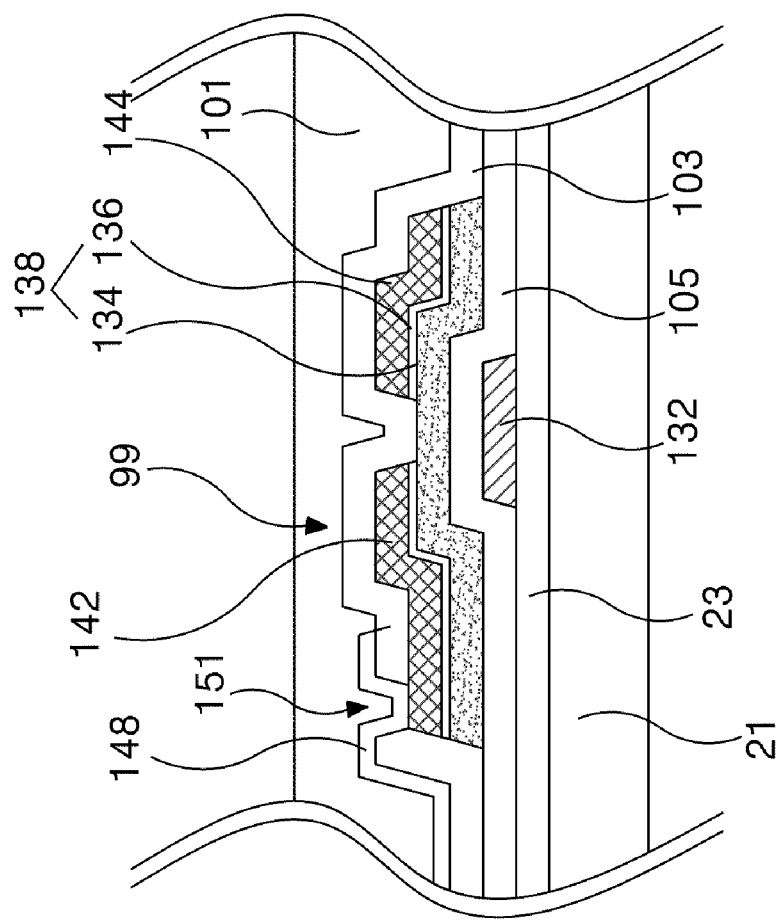
FIG. 7 illustrates an example of a flexible display device having a TFT in detail according to the present invention.

FIG. 7 illustrates an exemplary display element layer 25 used for the flexible display device according to the present invention. FIG. 7 shows a TFT array layer as the display element layer 25 of a display device such as an LCD display.

As shown in FIG. 7, the TFT 99 includes a gate electrode 132 connecting to a gate line 112, a source electrode 144 connecting to a data line 122, a drain electrode 142 connecting to a pixel electrode 148, and a semiconductor layer 138 forming a channel between the source electrode 144 and the drain electrode 142 and overlapping the gate electrode 132 on a gate insulating layer 105. The semiconductor layer 138 includes an active layer forming the channel overlapping the source electrode 144 and the drain electrode 142, and an ohmic contact layer 136 for reducing the contact resistance between the active layer and the source electrode 144 or the drain electrode 142. The pixel electrode 148 is connected to the drain electrode 142 of the TFT 99 through the pixel contact hole 151 penetrating through a passivation layer 103. In response to the scan signal supplied through the gate line 112, the TFT 99 charges the video signal supplied through the data line 122 to the pixel electrode 148. The array of the TFT 99 is formed by multiple photo-lithography processes and etching processes.

As shown in the FIG. 7, the surface of the display device having TFT array does not have a level surface due to the various overlapped patterns. In the subsequent process for attaching the flexible substrate, if the flexible substrate is attached on the uneven surface of the display element layer having the TFT array, the pressing force for attaching the flexible substrate is not evenly applied to the display element layer. Therefore, the elements where the attaching force is large may be easily broken. This causes the defect on the TFT 99 performance or characteristics. To make the surface of the display element layer smooth, an overcoat layer 101 is deposited on the display element layer. The overcoat layer 101 makes the surface of display element layer having TFT 99 even leveled and acts as a buffer to disperse the pressure applied while attaching the flexible substrate. Further, the overcoat layer 101 can protect the TFT 99. The overcoat layer 101 is formed by depositing at least one of a resin, a liquefied silicon nitride (SiNx) or a silicon oxide (SiOx) and curing it at a certain temperature. Further, mixing the overcoat layer 101 material with the adhesive used for attaching the flexible substrate, the leveling of the display element layer and the attaching the flexible substrate can be conducted at the same time.

The first and second exemplary embodiments as described thus far use a glass substrate as the rigid substrate in the substrate transcription method. In the third exemplary embodiment of the present invention, the display element layer is formed on a stainless steel (or SUS) substrate which is cheaper than a glass substrate and easier to remove by the etching method. Herein, the flexible substrate is attached, and then, the rigid SUS substrate is removed by the etching method. Generally, iron chloride (FeCl$_2$) is used for etching the stainless steel substrate. Iron chloride can easily etch a ferrous material, such as stainless steel, but hardly etch the organic material. Therefore, in the third exemplary embodiment, a stainless steel substrate is used for the rigid substrate, and organic materials are used for the gate insulating layer, the passivation layer and the overcoat layer of the display element layer shown in the FIG. 7. An organic material is also used for the insulating protection layer, and an organic material is used for the flexible substrate. Further, iron chloride is used as the etchant for removing the rigid substrate.

Figure 8A:
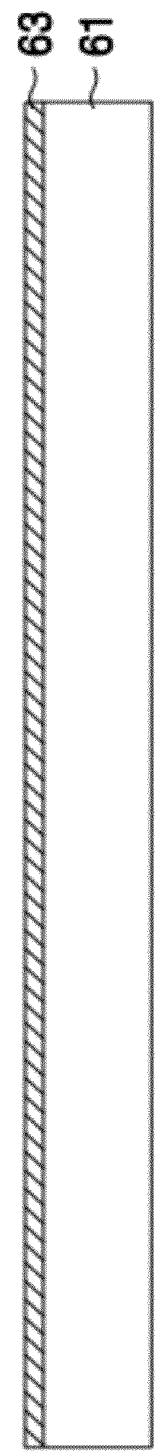
FIGS. 8A to 8E illustrate a method for manufacturing a flexible display device step-by-step according to a third embodiment of the present invention.
Figure 8B:
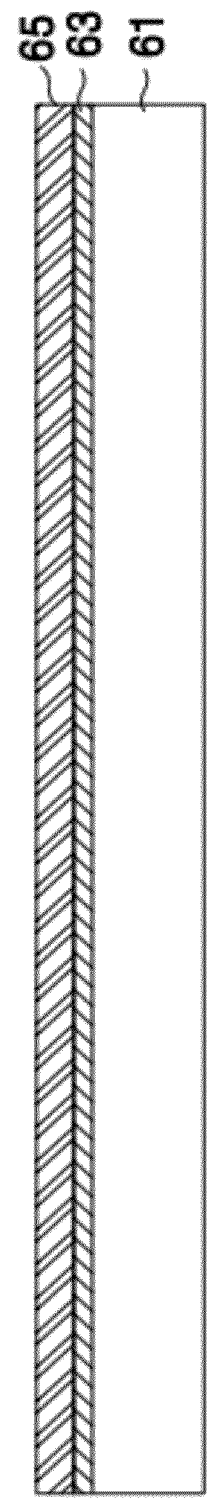
Figure 8C:
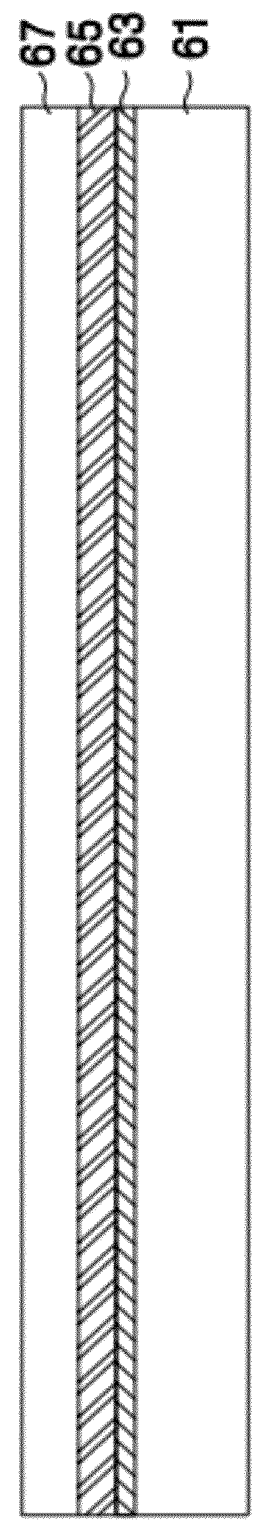
Figure 8D:
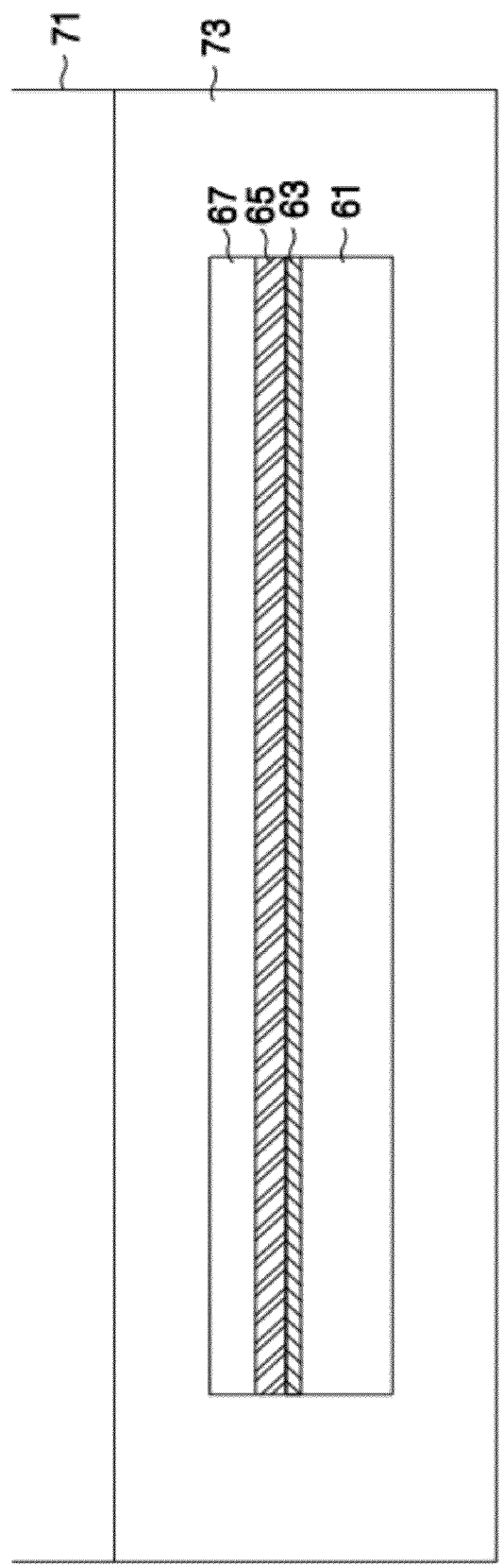
Figure 8E:
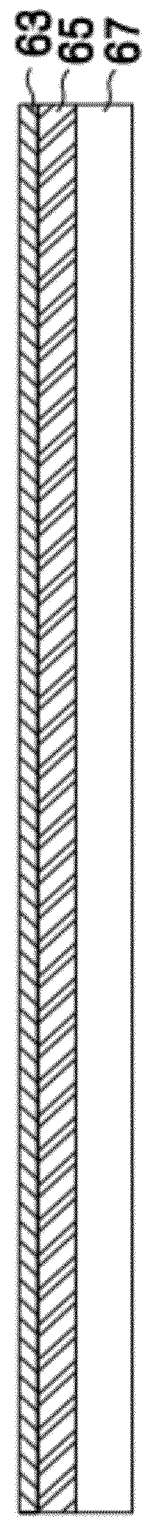

FIG. 8A illustrates the first step of a manufacturing method according to the third exemplary embodiment. On a stainless steel substrate 61, an insulating protection layer 63 is formed. The insulating protection layer 63 includes at least one of acrylic organic material, BCB (benzo cyclobutene), PFBC (Perfluorocyclobutane), Teflon, Cytop and Polyimide. Then, as shown in FIG. 8B, a display element layer 65 is formed on the insulating protection layer 63. At this time, when the TFT elements are formed as shown in FIG. 7, the gate insulating layer 105, the passivation layer 103 and the overcoat layer 101 include any one of acrylic organic material, BCB (benzo cyclobutene), PFBC (Perfluoro-cyclo-butane), Teflon, Cytop and Polyimide. Especially, at depositing the overcoat layer 101, the side parts of the display element layer 65 should be fully covered by the overcoat layer 101 to protect efficiently. Next, as shown in FIG. 8C, a flexible substrate 67 is attached on the display element layer 65. The flexible substrate includes organic material, such as plastic material. Finally, as shown in FIG. 8D, the whole substrate attaching the flexible substrate 67 is put into an etch bath 71 filled with the etchant 73 to remove the stainless steel substrate 61. The etchant 73 includes iron chloride (FeCl$_2$) or other suitable etchant or a combination of suitable etchants. At this time, the side portions of the display element layer 65 can be protected from the etchant by the organic insulating layer, organic passivation layer and organic overcoat layer. Further, the insulating protection layer 63 protects the display element layer 65 from the etchant while the stainless steel substrate 61 is entirely removed by the etching process. After the etching process, the substrate is taken out of the etching bath 71 and cleaned of any remaining etchant, the flexible substrate is completed as shown in the FIG. 8E. When the flexible substrate comprises multiple unit display panel arrayed in matrix type, the unit display panels are separated by a cutting process.

In accordance with exemplary embodiments of the present invention, the insulating protection layer has the 1/20 or less of the etching selectivity as compared to the rigid substrate so as not to be removed during the etching process for removing the rigid substrate. Therefore, the display element can be protected from the etchant used for removing the rigid substrate. As a result, the present invention ensures the stability in the manufacturing process of the flexible display device. Further, the present invention suggests a method for manufacturing process having increased production yield.

It will be apparent to those skilled in the art that various modifications and variations can be made in a method for manufacturing the flexible display device and a flexible display device of the present invention without departing from the spirit or scope of the invention. Thus, it is intended that the present invention cover the modifications and variations of this invention provided they come within the scope of the appended claims and their equivalents.

What is claimed is:

1. A manufacturing method for flexible display device, the method comprising:
    forming an insulating protection layer on a first substrate;
    forming a display element layer on the insulating protection layer;
    attaching a flexible substrate on the display element layer;
    forming an overcoat layer completely covering the display element layer and disposed between the display element layer and the flexible substrate; and
    etching the first substrate to remove the first substrate using an etchant comprising a selective etching ratio of the insulating protection layer to the first substrate of less than 1/20.

2. The manufacturing method of a flexible display device according to claim 1, wherein the insulating protection layer has a thickness of 1 µm or less.

3. The manufacturing method of a flexible display device according to claim 1, wherein the forming the insulating protection includes depositing any one of: a silicon layer, a silicon nitride layer, a silicon oxide layer, a metal oxide layer, and an organic layer on the first substrate.

4. The manufacturing method of a flexible display device according to claim 1, wherein the metal oxide layer includes at least one of: chrome oxide ($Cr_xO_y$), tantalum oxide ($Ta_xO_y$), and Aluminum oxide ($Al_xO_y$).

5. The manufacturing method of a flexible display device according to claim 1, wherein the organic layer includes at least one of: an acrylic organic material, BCB (benzo cyclobutene), PFBC (Perfluorocyclobutane), Teflon, Cytop, and Polyimide.

6. The manufacturing method of a flexible display device according claim 1, wherein the insulating protection layer comprises two or more layers.

7. The manufacturing method of a flexible display device according to claim 1, wherein the first substrate includes a glass substrate.

8. The manufacturing method of a flexible display device according to claim 7, wherein the etching the first substrate includes wet-etching the first substrate with an etchant including buffered hydrogen fluoride (HF+NH$_4$F: BHF).

9. The manufacturing method of a flexible display device according to claim 8, further comprising:

before the etching the first substrate, forming a resin barrier on the first substrate on a side opposite to an insulating protection layer; and after the etching the first substrate, removing the resin barrier.

10. The manufacturing method of a flexible display device according to claim 7, wherein the etching the first substrate includes dry-etching the first substrate with an etchant including any one of: $CF_4+O_2$ and $SF_6+O_2$.

11. The manufacturing method of a flexible display device according to claim 1, wherein the first substrate includes a stainless substrate.

12. The manufacturing method of a flexible display device according to claim 11, wherein the etching the first substrate includes wet-etching the first substrate with an etchant including iron chloride ($FeCl_2$).

* * * * *